United States Patent [19]
Ho et al.

[11] Patent Number: 5,980,284
[45] Date of Patent: Nov. 9, 1999

[54] EJECTOR MECHANISM FOR A MEMORY CARD CONNECTOR

[75] Inventors: Yu-Ming Ho, Pen-Chiao; Hsieh Kun Lee, Chung-Ho, both of Taiwan

[73] Assignee: Hon Hai Precision Ind. Co., Ltd., Taipei Hsien, Taiwan

[21] Appl. No.: 08/858,790

[22] Filed: May 19, 1997

[51] Int. Cl.⁶ .................................................. H01R 13/62
[52] U.S. Cl. .................................................. 439/159
[58] Field of Search ...................... 439/159, 160, 439/152

[56] References Cited

U.S. PATENT DOCUMENTS

| | | |
|---|---|---|
| 4,952,161 | 8/1990 | Komatsu . |
| 5,026,296 | 6/1991 | Hashiguchi ............................ 439/159 |
| 5,197,894 | 3/1993 | Koite ...................................... 439/159 |
| 5,634,805 | 6/1997 | Saito et al. ............................. 439/159 |

FOREIGN PATENT DOCUMENTS

| | | |
|---|---|---|
| 1-132074 | 9/1989 | Japan . |
| 2-52279 | 4/1990 | Japan . |
| 2-91183 | 7/1990 | Japan . |
| 78101926 | 2/1990 | Taiwan . |
| 80103737 | 11/1991 | Taiwan . |
| 83205851 | 11/1994 | Taiwan . |
| 82217793 | 1/1995 | Taiwan . |

*Primary Examiner*—Neil Abrams
*Assistant Examiner*—J. F. Duverne

[57] ABSTRACT

An ejector mechanism for a memory card connector comprising a housing, a shroud retained in a stationary relationship with respect to the housing, a pushing bar slidably mounted to the shroud. A separated elongate member having an integral stop is secured to the pushing bar. A coil spring is provided about the elongate member and compressed between a portion of the elongate member and the shroud. The coil spring urges the elongate member relative to the shroud to a resting position where the stop of the elongate member abuts against the shroud. With the stop integral with the elongate member to serve as a stop arrangement, the elongate member is prevented from disengaging from the rest of the pushing bar.

6 Claims, 5 Drawing Sheets

EJECTOR MECHANISM FOR A MEMORY CARD CONNECTOR

BACKGROUND OF THE INVENTION

1. Field of the Invention

The invention relates to ejector mechanism for a memory card connector.

2. The Prior Art

Memory card connectors are popularly used in the recent computer industry. A number of various conventional memory card connectors having ejecting means can be found, for example, in Japanese Utility Model Opening Nos. 2-91183, 2-52279, 1-132074, U.S. Pat. Nos. 5,026,296, 4,952,161, and Taiwan Patent Application Nos. 8221793, 80103737, 78101926, 83205851. One type of ejecting means for a conventional memory card connector is illustrated in FIGS. 1 and 2. As can be seen in FIG. 1, the conventional withdrawal means 1 of ejecting means for a memory card connector comprises a coil spring 2 having a number of continuous turns of the same diameter. Because the height of the end support 4 is limited, this arrangement has the problem that the end of the spring will exceed the end support 4 and thus be biased from its central axis due to unbalanced lateral forces. This decreases the spring function of the coil spring, and in an even worse situation, makes the withdrawal means lose it function completely. In addition, the withdrawal means 1 is retained on a portion of the memory card connector by a shroud 3 thereof and has one end in interference fit with an actuator member 5, as shown in FIG. 2. This arrangement, however, has the problem that the withdrawal means 1 is liable to disengage from the actuator member 5 due to excessive spring force exerting on the actuator member 5.

Hence, there is a need for a memory card connector comprising ejector mechanism which eliminates the above-mentioned defects of current memory card connectors.

SUMMARY OF THE INVENTION

Accordingly, one object of the present invention is to provide a memory card connector which has ejector mechanism effecting excellent withdrawal function.

Another object of the present invention is to provide a memory card connector which has ejector mechanism effectively retained on the connector and attached to the pushing bar.

To fulfill the above-mentioned objects, according to one embodiment of the present invention, an ejector mechanism for a memory card connector comprises a housing; an ejecting plate movably retained on the housing; a lever pivotably fixed to the main body and pivotably connected to the ejecting plate; a pushing bar being movably retained on the housing and connected to the lever for moving the lever and the ejecting plate from a first resting position relation to a second limiting position relation while an external pushing force exerted on the pushing bar to eject a memory card received in the housing; and a coil spring provided on the pushing bar including a plurality of continuous turns having varying diameters for providing spring force between the housing and the pushing bar so as to urge the pushing bar, the lever and the ejecting plate to the first resting position relation.

In another embodiment, the pushing bar may comprise an actuator member for actuating the lever and a withdrawal member retaining the coil spring. The withdrawal member is connected to the actuator member and movably retained by at least one shroud formed on the housing.

In still another embodiment, the withdrawal member may comprise a stop protruding in a direction perpendicular to a moving direction of the withdrawal member for restricting a further rearward movement of the withdrawal member when the stop is stopped by the shroud in a rearward movement.

In another embodiment, the coil spring is positioned by a pair of posts extending from two opposite end faces of a recess formed on the withdrawal. The diameter of the turns of the coil spring descends gradually from a central portion to both ends of the coil spring. A plurality of central turns of the coil spring tightly abutting side by side to each other.

In still another embodiment, the pushing bar comprises a pushing member for exerting an external pushing force. In addition, a securing plate maybe firmly retained on the housing for pivotably securing the lever thereon.

In still another embodiment, the housing comprises a main body and two arms extending rearward from two opposite ends of the main body. The securing plate, the ejecting plate and the lever are retained on the securing plate, and the pushing bar is retained on one of the arms.

DETAILED DESCRIPTION OF THE PREFERRED EMBODIMENTS

Figure 1:
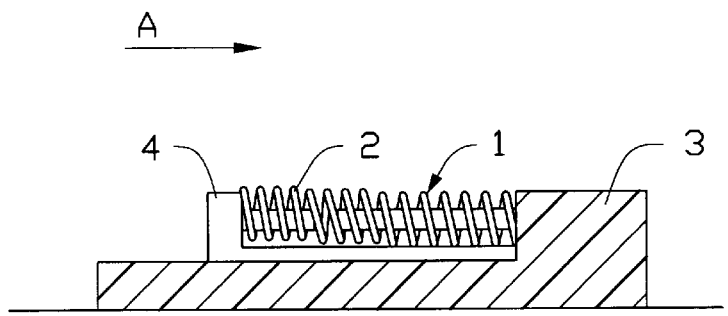
FIG. 1 shows withdrawal means of a conventional ejecting mechanism.
Figure 2:
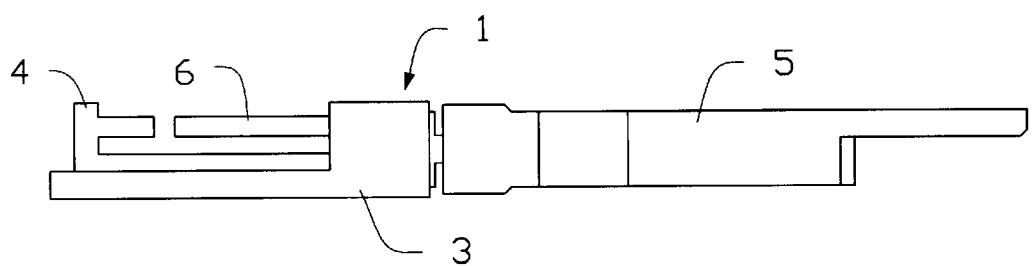
FIG. 2 shows withdrawal means of the ejecting mechanism shown in FIG. 1 with an end thereof connected to a pushing bar.
Figure 3:
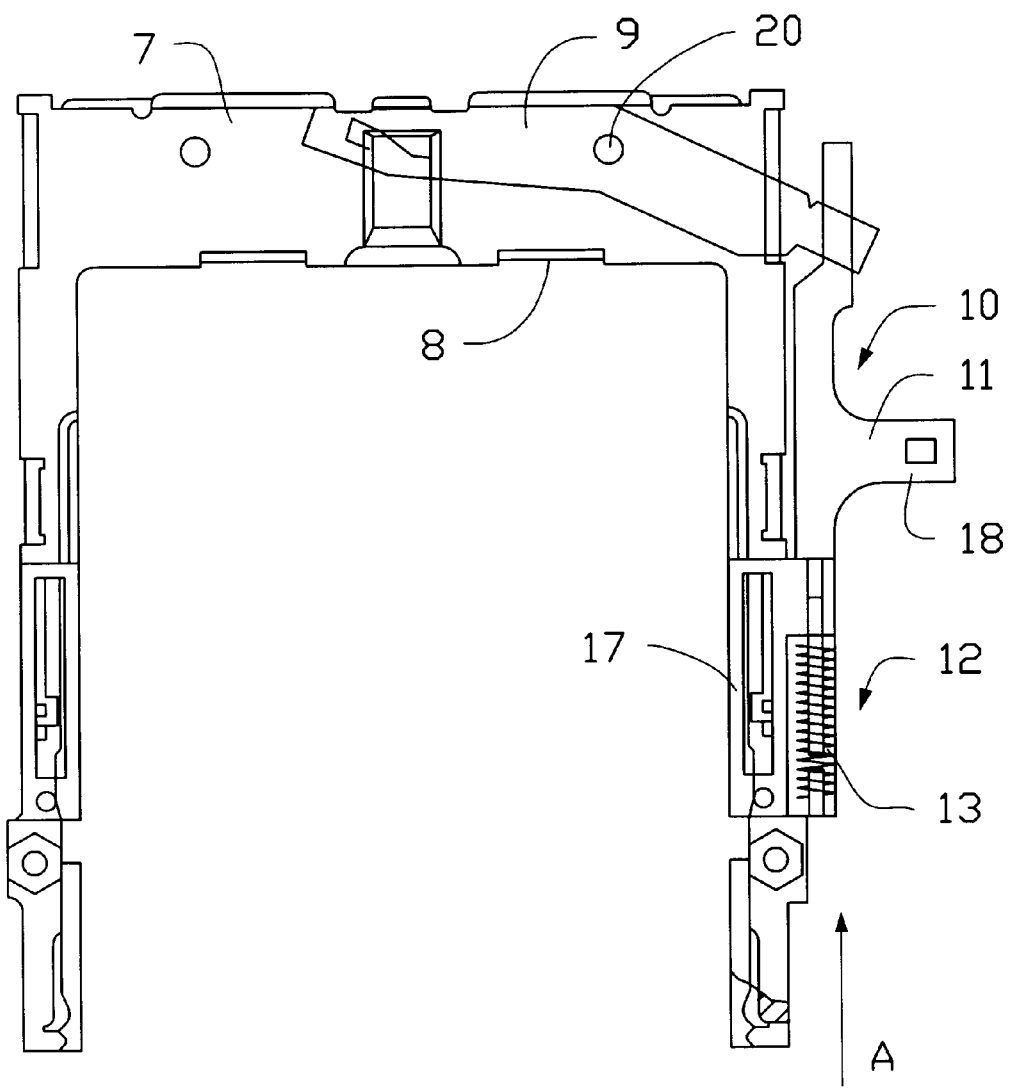
FIG. 3 shows a front view of an ejector mechanism for a memory card connector according to a preferable embodiment of the present invention.
Figure 3A:
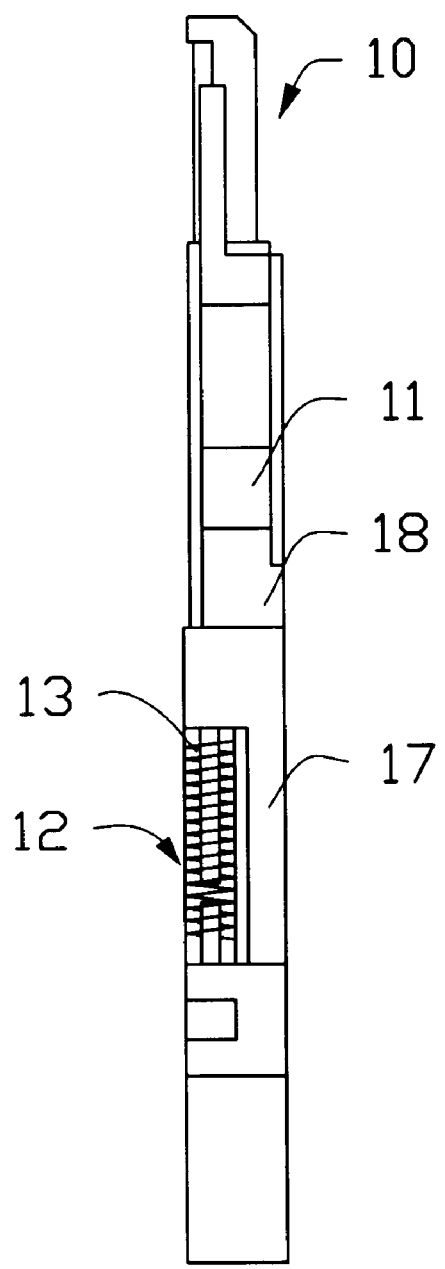
FIG. 3A shows a lateral view of the ejector mechanism.

Referring now to FIG. 3, an ejector mechanism according to the present invention mainly comprises a housing, a securing plate 7, an ejecting plate 8, a lever 9 and a pushing bar 10. The housing includes a main body and a pair of arms extending rearward from both ends of the main body. The securing plate 7 is firmly fixed on the housing for movably retaining the ejecting plate 8 and pivotably retaining the lever 9 thereon. The pushing bar 10 is slidably retained by a shroud 17 (see FIG. 4) on one arm of the housing. The lever 9 is rotatably connected at one end portion thereof to the ejecting plate 8, and is rotatably connected at the other end portion thereof to the pushing bar 10.

Please also refer to FIG. 3. In one preferable embodiment, the pushing bar 10 comprises an actuator member 11 having a lateral pushing member 18 for exerting an external force thereon so as to push the lever 9 in a forward direction by an end portion of the pushing bar 10. The lever 9 then pivots around a pivoting point 20 and pushes the ejecting plate 8 in a rearward direction by the other end. A memory card (not shown) received in the ejector mechanism is thus ejected rearward by a rear portion of the ejecting plate 8.

Figure 4A:
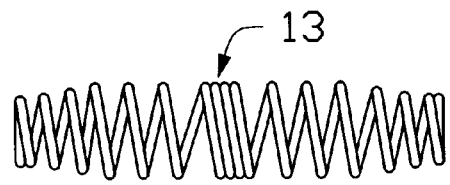
FIG. 4A shows a coil spring of the withdrawal means.
Figure 4:
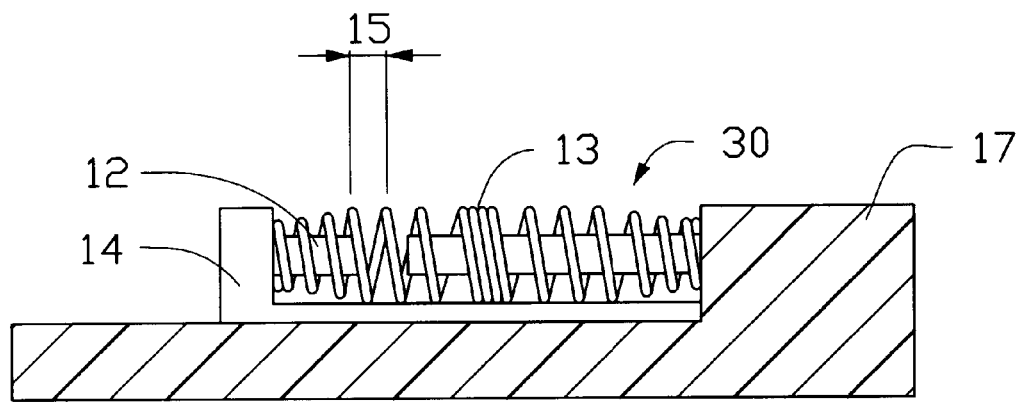
FIG. 4 shows withdrawal means of the present ejecting mechanism.

Also referring to FIG. 4, the pushing bar 10 further comprises withdrawal means 30 at a rear portion for withdrawing the pushing bar 10 back to its original resting position after the pushing bar 10 is pushed forward. In one embodiment, the withdrawal means 30 is in interference fit with the rear end of the pushing bar 10 and slidably retained on one arm of the housing by a shroud 17 formed on the arm. The withdrawal means 30 comprises an elongate member 12 and spring means 13 received in the elongate member 12 for providing spring force between the arm and the pushing bar 10.

In one embodiment, the spring means is a coil spring 13 including a plurality of turns having varying diameters. The coil spring 13 is received in a recess formed on a lateral side of the elongate member 12 and positioned by a pair of posts extending from two opposite inner surfaces of the recess. The posts are aligned to each other and a gap 15 exists between respective adjacent end faces of the posts for providing the coil spring 13 thereon. When the pushing bar 10 is assembled to the arm of the housing, a forward end of the coil spring 13 abuts a rear end face of the shroud 17 and a rear end of the coil spring 13 abuts a rear inner face of the recess so as to exert a spring force between the elongate member 12 and the shroud 17. The posts may have different lengths so that the gap 15 offsets from the center position of the recess, which facilitates the mounting of the coil spring 13.

In one embodiment, the coil spring 13 of varying diameters may have a large diameter at its middle turns. The diameter of the turns decreases gradually from the middle portion to both ends of the coil spring 13 so that the end of the coil spring 13 will not exceed the inner face of the recess. In addition, the middle turns of the coil spring 13 tightly abut side by side to each other. Because of this special configuration, the present spring means will not bias from its central axis due to unbalanced lateral forces, and thus exhibits excellent spring function.

Figure 5:
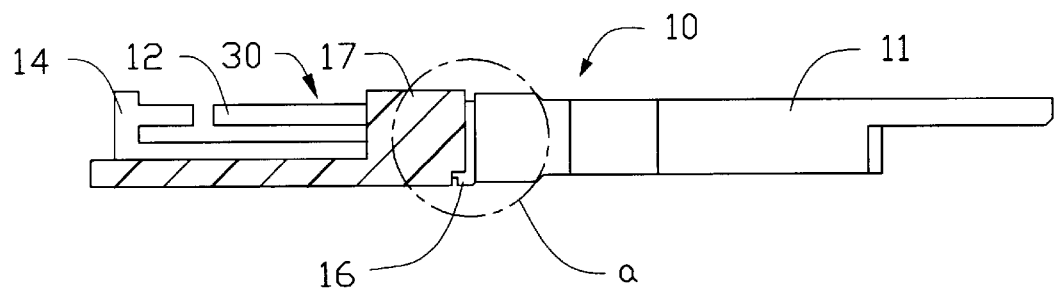
FIG. 5 shows withdrawal means of the present ejecting mechanism shown in FIG. 4 with an end thereof connected to a pushing bar.
Figure 5A:
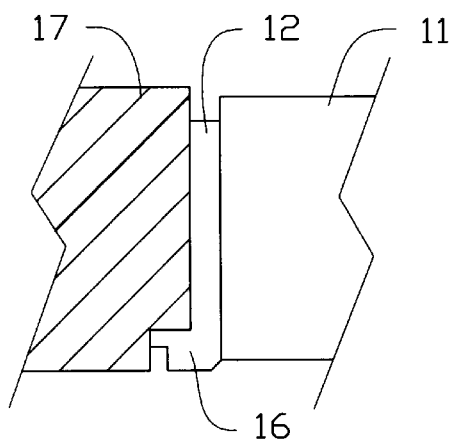
FIG. 5a is an enlarged view of the circle portion marked "a" of the withdrawal means shown in FIG. 5.

Please refer now to FIGS. 5 and 5a, wherein FIG. 5a is an enlarged view of the circle portion marked "a" of the withdrawal means 30 shown in FIG. 5. The front end of the elongate member 12 of the withdrawal means 30 has a stop 16 laterally protruding therefrom. The rearward motion of the elongate member 12 relative to the arm is limited by the abutment of the stop 16 to an end portion of the shroud 17. Thus, the rear end of the actuator member 11 will not engage the shroud 17. Therefore, according to the present invention, the withdrawing spring force will not be exerted on the actuator member 11 of the pushing bar 10 and this assures the firm connection between the withdrawal means 30 and the actuator member 11.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

It is claimed that:

1. An ejector mechanism for memory card connector, comprising:

a housing including a main body and two arms extending rearward from two opposite ends of said main body;

an ejector plate movably retained on said main body;

a lever pivotably fixed with regard to the main body and pivotably connected to said ejecting plate;

a pushing bar being movably retained on one of the arms and connected to said lever for actuating said ejecting plate by the pivoting movement of said lever to eject a memory card received in said housing while an external pushing force is exerted on said pushing bar; and a coil spring provided on the pushing bar and including a plurality of continuous turns having varying diameters for providing spring force between said arm and said pushing bar so as to urge the pushing bar, the lever and the ejecting plate to the first resting position relation.

2. The ejector mechanism as claimed in claim 1, wherein said coil spring is positioned by a pair of posts extending from said pushing bar into said coil spring from both ends thereof.

3. The ejector mechanism as claimed in claim 1, wherein the diameters of said turns of said coil spring decrease gradually from a central portion to both ends of said coil spring.

4. The ejector mechanism as claimed in claim 1, wherein a plurality of central turns of said coil spring tightly abut side by side to each other.

5. The ejector mechanism as claimed in claim 2, wherein said pair of posts extend from two opposite inner surfaces of a recess of said pushing bar and align with each other.

6. The ejector mechanism as claimed in claim 5, wherein said pair of opposed posts have different length and define a gap between respective ends thereof for mounting said coil spring therethrough onto said posts.

* * * * *